United States Patent
Sanduleanu

(10) Patent No.: US 7,804,926 B2
(45) Date of Patent: Sep. 28, 2010

(54) PLL USING UNBALANCED QUADRICORRELATOR

(75) Inventor: Mihai Adrian Tiberiu Sanduleanu, Eindhoven (NL)

(73) Assignee: NXP B.V., Eindhoven (NL)

( * ) Notice: Subject to any disclaimer, the term of this patent is extended or adjusted under 35 U.S.C. 154(b) by 952 days.

(21) Appl. No.: 10/533,058

(22) PCT Filed: Oct. 8, 2003

(86) PCT No.: PCT/IB03/04462

§ 371 (c)(1),
(2), (4) Date: Apr. 27, 2005

(87) PCT Pub. No.: WO2004/042927

PCT Pub. Date: May 21, 2004

(65) Prior Publication Data

US 2006/0050829 A1    Mar. 9, 2006

(30) Foreign Application Priority Data

Nov. 5, 2002 (EP) .................................. 02079609

(51) Int. Cl.
*H03D 3/24* (2006.01)
(52) U.S. Cl. ............... 375/375; 375/371; 375/373; 375/374; 327/157; 327/159
(58) Field of Classification Search .................. 331/1 A, 331/25; 375/215, 294, 324, 327, 373–376; 327/157, 159, 536; 326/17, 20
See application file for complete search history.

(56) References Cited

U.S. PATENT DOCUMENTS 5,734,301 A * 3/1998 Lee et al. .................. 331/2
5,757,857 A 5/1998 Buchwald
6,081,572 A * 6/2000 Filip ........................ 375/376
6,125,158 A 9/2000 Carson et al.
6,218,907 B1 * 4/2001 Tamaki et al. .............. 331/25
6,320,406 B1 * 11/2001 Morgan et al. .............. 326/14
6,496,555 B1 12/2002 Soda (Continued)

FOREIGN PATENT DOCUMENTS

JP    6-216766 A    8/1994

(Continued)

OTHER PUBLICATIONS

Jafar Savoj et al: "Design of Half-Rate Clock and Data Recovery Circuits for Optical Communication Systems" Proceedings of the 38$^{TH}$ Ann. Design Auto. Conf. (DAC). Jun. 18-22, 2001.

(Continued)

*Primary Examiner*—David C Payne
*Assistant Examiner*—James M Perez

(57) ABSTRACT

A Phase Locked Loop (1) used in a data and clock recovery comprising a frequency detector (10) including a quadricorrelator (2), the quadricorrelator (2) comprising a frequency detector including double edge clocked bi-stable circuits (21, 22, 23, 24) coupled to a first multiplexer (31) and to a second multiplexer (32) being controlled by a signal having a same bitrate as the incoming signal (D), and a phase detector (DFF) controlled by a first signal pair (PQ, $\overline{PQ}$) provided by the first multiplexer (31) and by a second signal pair (PI, $\overline{PI}$) provided by the second multiplexer (32).

7 Claims, 3 Drawing Sheets

U.S. PATENT DOCUMENTS 6,853,696 B1 * 2/2005 Moser et al. ................ 375/375
7,409,027 B1 * 8/2008 Sudjian ...................... 375/374

FOREIGN PATENT DOCUMENTS

JP    11-308097 A    11/1999
JP    2000-124801 A    4/2000

OTHER PUBLICATIONS

Yoon, Chan G, et al: "Digital Logic Implementation of the Quadricorrelators for Frequency Detector" Dept. of Electronics Engineering, Seoul Nat. Univ. Shinlim Dong, Kwanak Ku, Seoul, 151-742, Korea.
Office Action from Japanese Patent Appln. No. 2004-549408 (Jul. 10, 2009).

* cited by examiner

PLL USING UNBALANCED QUADRICORRELATOR

The invention relates to a Phase Locked Loop (PLL) comprising a frequency detector including an unbalanced quadricorrelator.

PLL circuits are widely used in modern communication circuits for tuning receivers. Normally a PLL comprises a voltage-controlled oscillator (VCO), a frequency control loop having a frequency detector and a phase control loop including a phase detector. When the incoming signal in the PLL is a high-speed Non Return to Zero (NRZ) random signal, phase detectors and frequency detectors have the difficult task to work on random transitions of the incoming signal. PLLs using NRZ signals are often called data and clock recovery circuits (DCR). Between transitions the phase and frequency detectors should maintain the phase error and frequency error information such that the voltage controlled oscillator is not pulled away from lock when transitions are missing.

A known implementation of the frequency detector is the quadricorrelator concept as in "Digital Logic Implementation of Quadricorrelators for Frequency detectors", by C. G. Yoon, S. Y. Lee and C. W. Lee, IEEE Proc. of $37^{th}$ MidWest Symposium on Circuits and Systems, 1994, pp. 757-760. A model for an unbalanced digital quadricorrelator is an unbalanced analog quadricorrelator as shown in FIG. 1. The analog quadricorrelator comprises a first pair of mixers M1, M2 supplied by quadrature signals I, Q and input signal In. Outputs of said pair of mixers M1, M2 are coupled to a pair of low-pass filters L1, L2, the filters providing signals Vi and Vq, respectively. The signal Vi is inputted to a derivation circuit D. The signal Vq and the signal provided by the derivation circuit D are inputted to a third mixer M3, the mixer generating a signal FD, which is indicative for a frequency error between the input signal In and quadrature signals I, Q. In the above-mentioned document a digital implementation of the analog balanced quadricorrelator, is presented. The digital implementation comprises single edge flip-flops coupled to a combinatorial network. Hence, the flip-flops detects only phase shifts between quadrature inputs and a rising edge of the D input signal, which means that this quadricorrelator works at half rate or 2*Tbit. Tbit is defined as the time period for a high or a low binary level. Furthermore, the combinatorial part of the quadricorrelator comprises 6 AND gates and 2 OR gates that cause delays or, alternately, phase-shifts between the signals provided by the quadricorrelator.

It is therefore an object of this invention to mitigate at least some of the above mentioned problems.

In accordance with the invention this is achieved in a device as described in the first paragraph being characterized in that the quadricorrelator comprises a frequency detector including double edge clocked bi-stable circuits coupled to a first multiplexer and to a second multiplexer being controlled by a signal having a same bitrate as the incoming signal, and a phase detector controlled by a first signal pair provided by the first multiplexer and by a second signal pair provided by the second multiplexer. According to the invention, the input information is read on both the rising and falling edges of the clock signal, meaning that the input information is read every half period of the clock i.e. at Tbit rate. This feature could be implemented either having a direct coupling between the clock signal and bi-stable circuits or using intermediate signals obtained during processing input signal having the same Tbit. This means that bi-stable circuits could be combined with combinatorial circuits having a control input e.g. multiplexers for working at Tbit speed. Furthermore, the phase detector comprises a double edge bi-stable circuit and therefore it preserves the Tbit speed. It is further observed that a delay of a signal through one bi-stable circuit is expected to be less that a delay through three layers of combinatorial circuits as used in the prior-art.

In an embodiment of the invention the frequency detector comprises a first pair of double edge clocked bi-stable circuits coupled to the first multiplexer and a second pair of double edge clocked bi-stable circuits coupled to the second multiplexer, which first and second pairs are supplied by mutually quadrature phase shifted signals, respectively, to provide the first signal pair and the second signal pair indicative for a phase difference between the incoming signal and mutually quadrature phase shifted signals. The first multiplexer and the second multiplexer provide a first signal and a second signal indicative for a phase difference between the incoming signal and mutually quadrature phase shifted signals. The mutually quadrature phase shifted signals are generated by a voltage controlled oscillator. In many applications as optical networking a clock recovery is necessary especially when the clock information in missing from the input signal as in Non Return to Zero (NRZ) signals. Furthermore, clock recovery circuits, which are in fact PLLs having a quadrature voltage-controlled oscillator providing quadrature signals i.e. mutually shifted with 45 degrees. PLLs also have a phase detector and a frequency detector. The outputs of the multiplexers are updated only on the transitions of the incoming signal maintaining the same error at the output between transitions. The phase difference between the incoming signal and quadrature clock signals is transformed in a positive or negative quantified signal. When this signal is positive the clock increases its phase and for negative signals, the clock decreases its phase.

In another embodiment of the invention the phase detector comprises a D flip-flop receiving the first signal pair and being clocked by the second signal pair, the second signal pair being inputted to respective gates of a first transistor pair for determining a state ON or OFF of a current through said first transistor pair. The current through the first transistor pair biases a second transistor pair, the second transistors pair receiving the first signal pair and generating an output signal indicative for a frequency error between the incoming data signal and Clock signals. According to the second signals pair, the current can flow in the source of the first transistors or can be dumped to Vcc. In equilibrium, a differential output of the frequency detector is zero.

The above and other features and advantages of the invention will be apparent from the following description of the exemplary embodiments of the invention with reference to the accompanying drawings, in which.

Figure 1:
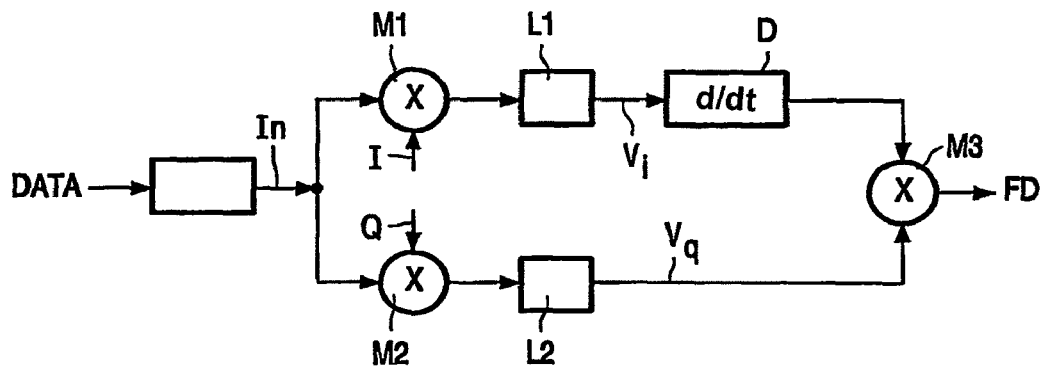
FIG. 1 depicts a prior art quadricorrelator.
Figure 2:
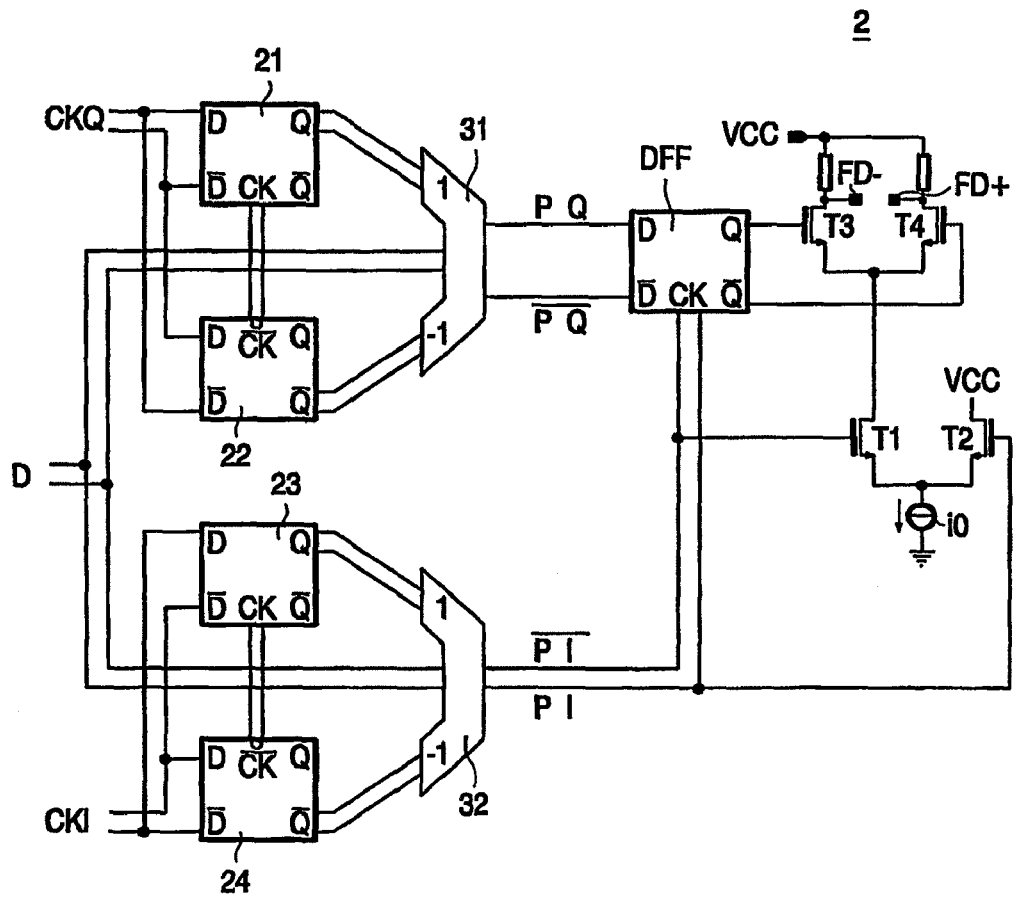
FIG. 2 depicts a schematic diagram of digital quadricorrelator according to the invention.

FIG. 2 depicts a schematic diagram of digital quadricorrelator according to the invention. The quadricorrelator 2 comprises double edge clocked bi-stable circuits 21, 22, 23, 24 coupled to multiplexers 31, 32 being controlled by a signal having the same bit rate as the incoming signal D. A first pair of double edge clocked bi-stable circuits 21, 22 coupled to a first multiplexer 31 and a second pair of double edge clocked bi-stable circuits 23, 24 coupled to a second multiplexer 32 are supplied by mutually quadrature phase shifted signals CKQ and CKI respectively and providing a first pair of signals PQ, $\overline{PQ}$ and a second pair of signals PI, $\overline{PI}$ indicative for a phase difference between the incoming signal D and mutually quadrature phase shifted signals CKQ, CKI. It could be pointed out here that the bi-stable circuits could be flip-flops or latches. For the purpose of illustration in FIG. 2 is shown an implementation using D-type latches. The mutually quadrature signals are generated by a voltage controlled oscillator VCO, shown in FIG. 5.

Figure 4:
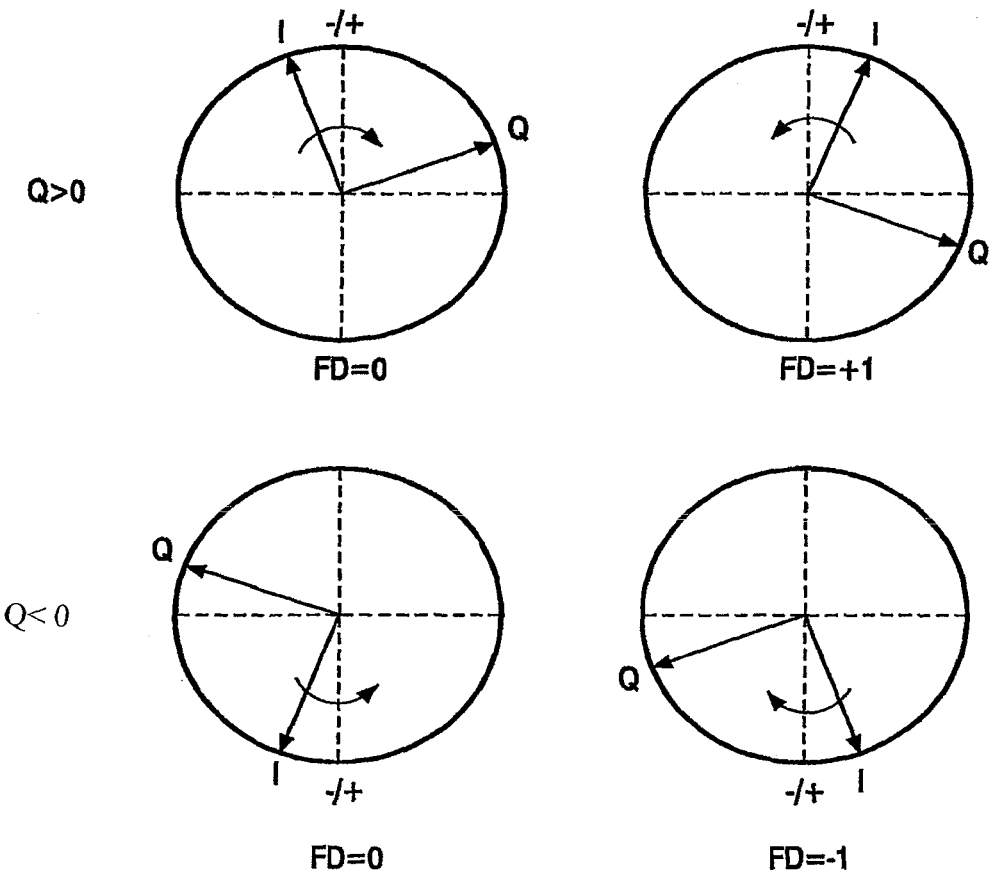
FIG. 4 depicts frequency detection algorithm, according to the invention.

The combination latch-multiplexer performs as a latch clocked on both transitions of the incoming signal D. The incoming signal D transitions are sampled by the two quadrature signals CKQ and CKI at Tbit rate. The outputs of the multiplexers are updated only on the incoming signal D transitions keeping the same error at the output between transitions. The second signal pair PI, $\overline{PI}$ is the output of the phase detector and the first pair of signals PQ, $\overline{PQ}$ is in quadrature with it. The phase difference between the incoming signal D and CKQ, respectively CKI is transformed in a positive or negative quantified signal. When this signal is positive the clock increases its phase and for negative signals, the clock decreases its phase. Let denote the first pair of signals PQ, $\overline{PQ}$ as Q and the second pair of signals PI, $\overline{PI}$ as L and let us further observe that the signals I and Q are differential signals i.e. they are mutually shifted by substantially 180 degrees. The phase detector comprises a D flip-flop DFF receiving the first signal pair Q and being clocked by the second signal pair I. The second signals pair I is inputted to a first transistor pair T1, T2 respective gates for determining a state ON or OFF of a current I0 through said first transistors pair T1, T2. The current I0 is generated by a current source coupled to a common source node of the transistors T1, T2. The current I0 through the first transistor pair T1, T2 biases a second transistor pair T3, T4, the second transistor pair T3, T4 receiving the first signal pair Q and generating an output signal FD+, FD– indicative for a frequency error between the incoming data signal D and Clock signals CKI, CKQ. Let us denote the output signal FD+, FD– as FD. The algorithm can be visualized as shown in FIG. 4. Obviously the four possible cases will converge towards the equilibrium position. Table 1 presents the four situations and can be used to build the logic for the frequency detector.

As shown in FIG. 2, the second signal I is used to clock the D latch DFF, sampling the first signal Q. According to the I values, the current Io can flow in the source of the first transistor pair T1, T2 or can be dumped to Vcc. In equilibrium, when I is positive the first transistor pair T1, T2 is not active any longer and the differential output FD of the frequency detector is zero. Now, only the phase detector contributes to the phase correction.

TABLE 1

Frequency detector logic

| PD_I (I vector) | PD_Q (Q vector) | FD |
|---|---|---|
| –/+ | –1 | 0 |
| –/+ | 1 | 0 |
| +/– | –1 | –1 |
| +/– | 1 | +1 |

Figure 3:
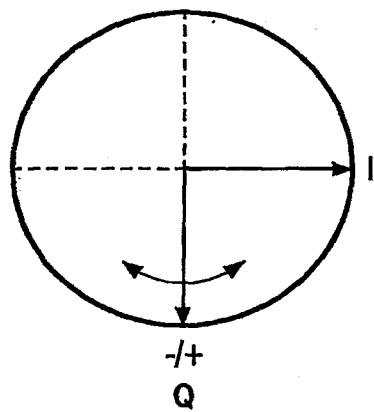
FIG. 3 depicts rotating wheel analogy for mutually quadrature signals.

The equilibrium position for the signals I and Q can be represented with the rotating wheel analogy as shown in FIG. 3. When it is a phase lock, the vector I is positive, stable and equal with +1 and the Q vector bounces from the positive to the negative quadrant in a periodic fashion. Frequency error generation signal for the frequency detector is explained with the aid of FIG. 4 and comprises the following steps:

When I has a negative to positive transition for positive Q vectors, keep the frequency by generating a zero signal at the output of the frequency detector.

When I has a negative to positive transition for negative Q vectors, keep the frequency by generating a zero signal at the output of the frequency detector.

When I has a positive to negative transition and Q is positive, increase the frequency (FD=+1)

When I has a positive to negative transition and Q is negative, decrease the frequency (FD=–1).

When the clock is too slow as shown in FIG. 4, the pair of the two quadrature signals I and Q rotate counter-clockwise with an angular frequency equal to the frequency difference Δω and the derivative of the signal I failing on top of Q signal generating an error signal.

When the clock is too fast, the pair of the two quadrature signals I and Q rotate clockwise with an angular frequency equal to the frequency difference Δω and the derivative of the signal I falling in top of signal Q with 180° phase difference signal generating an error signal.

Figure 5:
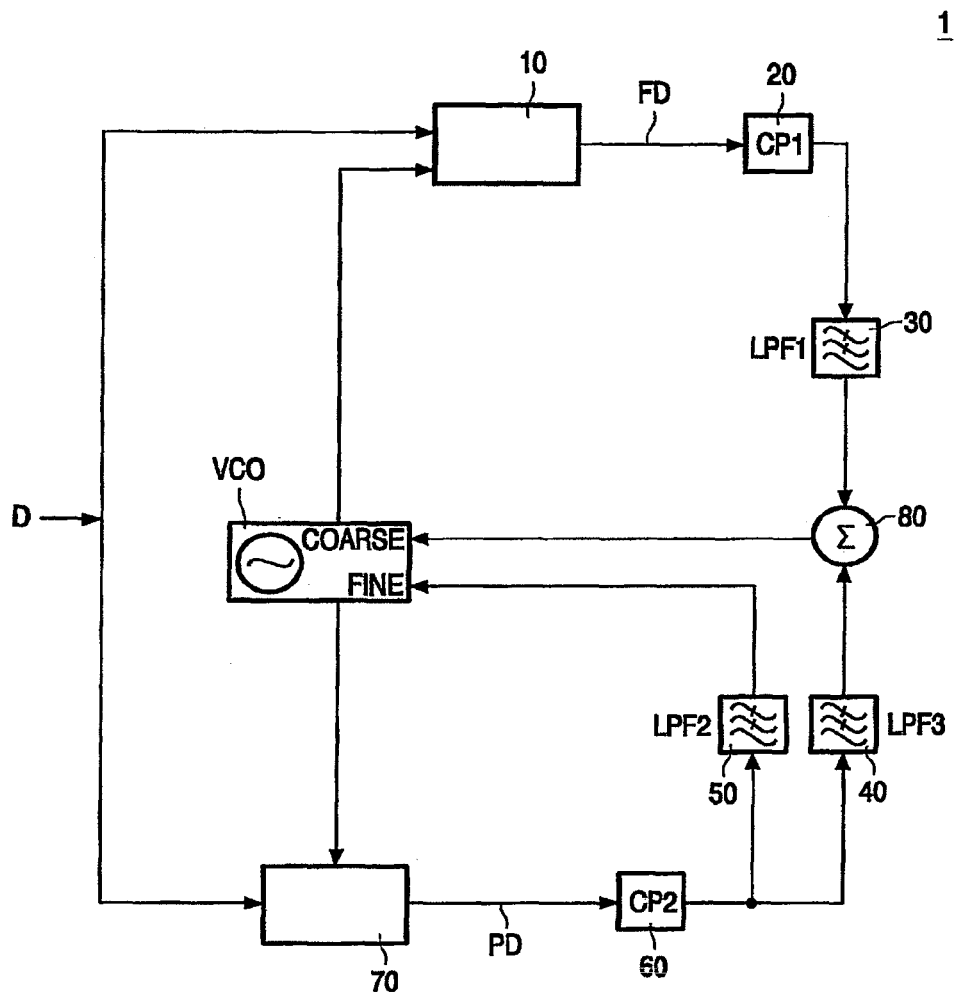
FIG. 5 depicts a PLL having a frequency detector as described in the present invention.

FIG. 5 depicts a PLL having a frequency detector 10 as described in the present invention. The error signal FD is inputted to a coarse control input C of the voltage controlled oscillator VCO via a first charge pump 20 coupled to a first low-pass filter 30 coupled to a second adder 80. The frequency error signal FD is inputted to the coarse input C of the VCO because the VCO has to adapt as quickly as possible to frequency differences between the incoming signal D and the quadrature signals CKI and CKQ. A fine control input F of the VCO is controlled by a signal PD provided by a phase detector 70 coupled to a second charge pump 60 coupled to second low-pass filter 50.

Once the frequency lock is acquired the output of the frequency detector provides a zero DC signal at the output such that the VCO keeps the frequency information.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features. Throughout the description it was assumed that the signals L Q and F are binary signals having an ON state represented by a +1 value and an OFF state represented by a –1 value.

The invention claimed is:

1. A Phase Locked Loop, for synchronization of a clock signal with an incoming data signal, comprising
  a frequency detector including
    an unbalanced quadricorrelator, the quadricorrelator including
      a first multiplexer,
      a second multiplexer, and
      double edge clocked bi-stable circuits, supplied by incoming mutually quadrature phase shifted signals and coupled to the first multiplexer and to the second multiplexer, the first and second multiplexers controlled by a signal having a same bit-rate as the incoming signal; and
    a first phase detector that includes a D flip-flop that receives, as a data input, a first signal pair provided by the first multiplexer and that is clocked by a second signal pair provided by the second multiplexer;

a first transistor pair receiving the second signal pair on respective gates for determining a state ON or OFF of a current through the first transistor pair; and a second transistor pair biased by current through the first transistor pair and receiving the first signal pair and generating an output signal indicative for a frequency error between the incoming data signal and the clock signal.

2. A Phase Locked Loop as claimed in claim 1, wherein the frequency detector comprises a first pair of double edge clocked bi-stable circuits coupled to the first multiplexer, and a second pair of double edge clocked bi-stable circuits coupled to the second multiplexer, wherein the first and second pairs of bi-stable circuits are supplied by mutually quadrature phase shifted signals respectively to provide the first signal pair and the second signal pair indicative for a phase difference between the incoming signal and the mutually quadrature phase shifted signals.

3. A Phase Locked Loop as claimed in claim 2, further including a voltage controlled oscillator wherein the mutually quadrature phase shifted signals are generated by the voltage controlled oscillator.

4. A Phase Locked Loop as claimed in 3, further including
an adder;
a first charge pump; and
a first low-pass filter,
wherein a frequency error signal produced by the quadricorrelator is inputted to a coarse control input of the voltage controlled oscillator via the first charge pump coupled to the first low-pass filter coupled to the adder.

5. A Phase Locked Loop, for synchronization with an incoming data signal, comprising
a voltage controlled oscillator generating mutually quadrature phase shifted signals,
a frequency detector including an unbalanced quadricorrelator, the quadricorrelator including
a first multiplexer,
a second multiplexer,
a first pair of double edge clocked bi-stable circuits,
a second pair of double edge clocked bi-stable circuits,
wherein the first pair and the second pair of double edge clocked bi-stable circuits are supplied by the mutually quadrature phase shifted signals, respectively, to provide a first signal pair and a second signal pair indicative of a phase difference between the incoming data signal and the mutually quadrature phase shifted signals, and
a phase detector controlled by a first signal pair provided by the first multiplexer and by a second signal pair provided by the second multiplexer;
a first low-pass filter;
a second low-pass filter;
an adder;
a first charge pump for inputting a coarse control input for the voltage controlled oscillator using a frequency error signal produced by the quadricorrelator and coupled to the first low-pass filter and to the adder;
a second charge pump; and
a further phase detector;
wherein a fine control input is controlled by a signal provided by the further phase detector coupled to the second charge pump coupled to the second low-pass filter.

6. A Phase Locked Loop, for use with an incoming data signal, comprising:
a voltage controlled oscillator having a coarse control input and a fine control input and generating mutually quadrature phase-shifted signals;
a first charge pump;
a second charge pump;
a first low-pass filter;
a second low-pass filter;
an adder;
a quadricorrelator generating a frequency error signal inputted to the coarse control input of the voltage controlled oscillator via the first charge pump coupled to the first low-pass filter coupled to the adder, the quadricorrelator including
a frequency detector including
a first multiplexer,
a second multiplexer,
a first pair of double edge clocked bi-stable circuits coupled to the first multiplexer and
a second pair of double edge clocked bi-stable circuits coupled to the second multiplexer to provide a second signal pair, the first and second pairs of bi-stable circuits being supplied by the mutually quadrature phase shifted signals, the first and second multiplexers being controlled by a signal having a same bit-rate as the incoming signal and respectively providing a first signal pair and a second signal pair indicative for a phase difference between an incoming signal and the mutually quadrature phase shifted signals;
a transistor pair; and
a phase detector controlled by the first signal pair and the second signal pair, the phase detector including
a D flip-flop receiving the first signal pair and being clocked by the second signal pair, the second signal pair being inputted to respective gates of the transistor pair for determining a state ON or OFF of a current through said transistor pair; and
a second phase detector generating a phase error inputted to the fine control input of the voltage controlled oscillator via the second charge pump coupled to the second low-pass filter.

7. The Phase Locked Loop of claim 6, further including a third low-pass filter, wherein the phase error is further inputted to the coarse control input of the voltage controlled oscillator via the second charge pump coupled to the third low-pass filter coupled to the adder.

* * * * *